(12) United States Patent
Tan et al.

(10) Patent No.: US 11,376,977 B2
(45) Date of Patent: Jul. 5, 2022

(54) POWERTRAIN ARCHITECTURE FOR A VEHICLE UTILIZING AN ON-BOARD CHARGER

(71) Applicant: TEXAS INSTRUMENTS INCORPORATED, Dallas, TX (US)

(72) Inventors: Hui Tan, Sugar Land, TX (US); Manish Bhardwaj, Sugar Land, TX (US); Sangmin Kevin Chon, Houston, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/236,556

(22) Filed: Dec. 30, 2018

(65) Prior Publication Data

US 2020/0207227 A1    Jul. 2, 2020

(51) Int. Cl.
*B60L 53/24* (2019.01)
*H02J 7/00* (2006.01)
(Continued)

(52) U.S. Cl.
CPC .............. *B60L 53/24* (2019.02); *H02J 7/00* (2013.01); *H02M 1/4258* (2013.01); *H02M 3/33584* (2013.01); *B60L 2210/10* (2013.01); *B60L 2210/40* (2013.01); *H02J 2207/20* (2020.01); *H02P 27/06* (2013.01); *H05K 7/2089* (2013.01); *H05K 7/20845* (2013.01)

(58) Field of Classification Search
CPC .. B60L 53/24; B60L 2210/10; B60L 2210/40; H02J 7/0052; H02J 2007/0059; H02M 1/4258; H02M 3/33584; H02P 27/06; H05K 7/20845; H05K 7/2089

USPC ......... 307/9.1, 10.1; 320/109, 116, 134, 166
See application file for complete search history.

(56) References Cited

U.S. PATENT DOCUMENTS 8,684,118 B2   1/2014 Kosaka et al.
9,381,878 B2   7/2016 Ichikawa
(Continued)

FOREIGN PATENT DOCUMENTS

DE    112016002239 T5   2/2018
EP       2255990 A1   12/2010

OTHER PUBLICATIONS

International Search Report and Written Opinion for International Patent Application No. PCT/US0219/067364, dated Apr. 3, 2020, 6 pages.

(Continued)

*Primary Examiner* — Toan T Vu
(74) *Attorney, Agent, or Firm* — Carl G. Peterson; Charles A. Brill; Frank D. Cimino

(57) ABSTRACT

Techniques related to powertrain architectures for vehicles (such as hybrid electric vehicle/electric vehicles) utilizing an on-board charger are disclosed. The techniques include a device for power regulation, the device comprising a direct current (DC)-to-DC voltage converter configurable to convert a first DC voltage from an alternating current (AC)-to-DC converter to generate a first converted DC voltage to charge a battery, and convert a second DC voltage from the battery to a second converted DC voltage for a DC-to-AC inverter. The inverter couples to a motor. A control circuit is configured to direct an operating mode of the voltage converter.

17 Claims, 7 Drawing Sheets

(51) Int. Cl.
  *H02M 1/42* (2007.01)
  *H02M 3/335* (2006.01)
  *H02P 27/06* (2006.01)
  *H05K 7/20* (2006.01)

(56) References Cited

U.S. PATENT DOCUMENTS

| | | | |
|---|---|---|---|
| 10,381,922 B2 | 8/2019 | Okazaki et al. | |
| 2009/0242288 A1* | 10/2009 | Oyobe | B60L 15/007 180/65.265 |
| 2009/0315518 A1* | 12/2009 | Soma | B60L 58/20 320/134 |
| 2010/0019723 A1* | 1/2010 | Ichikawa | B60L 53/18 320/109 |
| 2010/0038962 A1* | 2/2010 | Komatsu | H02M 5/4585 307/10.1 |
| 2010/0101877 A1* | 4/2010 | Masfaraud | B60L 58/22 180/65.26 |
| 2011/0187184 A1* | 8/2011 | Ichikawa | B60L 1/003 307/10.1 |
| 2013/0200846 A1* | 8/2013 | Ang | B60L 50/51 320/109 |
| 2014/0028256 A1* | 1/2014 | Sugiyama | B60L 58/12 320/109 |
| 2016/0133959 A1* | 5/2016 | Kwon | H01M 8/0488 429/429 |
| 2018/0178775 A1 | 6/2018 | Ono | |
| 2018/0254697 A1* | 9/2018 | Ku | H02M 7/003 |
| 2018/0354370 A1 | 12/2018 | Horii | |

OTHER PUBLICATIONS

International Preliminary Report on Patentability for International Patent Application No. PCT/US0219/067364, dated Jun. 16, 2021, 4 pages.
Extended European Search Report for European Patent Application No. 19907501.1, dated Jan. 25, 2022, 7 pages.

* cited by examiner

POWERTRAIN ARCHITECTURE FOR A VEHICLE UTILIZING AN ON-BOARD CHARGER

BACKGROUND

Hybrid electric vehicles (HEV) and electric vehicles (EV) are increasing in popularity as they offer reduced fuel costs and lower vehicle emissions as compared to conventional internal combustion engine propelled vehicles. HEV/EVs are powered using one or more batteries driving one or more electrical motors. HEVs may be driven by motors and batteries used in conjunction with a conventional internal combustion engine. EVs are driven purely by motors and batteries.

Both HEVs and EVs consume large amounts of electricity, and this electricity is generally stored in one or more batteries. These batteries may be charged using a combination of regeneration using the motor acting as an electrical generator, or, when the vehicle is not in use, by an electric charger and external power source. The electric charger traditionally has come in on-board and off-board varieties. Off-board charging generally refers to charging systems utilizing a charging station or other equipment, such as a home or wall charger. These systems traditionally offer higher voltages and faster charging than traditional on-board charging systems, which utilize a charger built into the car itself. Increasingly, to provide flexibility and increased convenience, higher capacity on-board chargers are offering increased charging speeds.

SUMMARY

This disclosure relates generally to the field of HEV/EVs. More particularly, but not by way of limitation, aspects of the present disclosure relates to device for power regulation. The device comprises a direct current (DC)-to-DC voltage converter configurable to convert a first DC voltage from an alternating current (AC)-to-DC converter to generate a first converted DC voltage to charge a battery. The device further converts a second DC voltage from the battery to a second converted DC voltage for an inverter, the inverter electrically coupled to a motor, along with control circuitry for directing an operating mode of the DC-to-DC voltage converter.

Another aspect of the present disclosure relates to a system for power regulation. The system comprises a direct current (DC)-to-DC voltage converter having two operating modes, wherein the DC-to-DC voltage converter, in a first operating mode, converts a first DC voltage from an alternating current (AC)-to-DC converter to generate a first converted DC voltage to charge a battery. The DC-to-DC voltage converter, in a second operating mode, converts a second DC voltage from the battery to a second converted DC voltage for an inverter, the inverter electrically coupled to a motor. The system further comprises control circuitry for directing an operating mode of the DC-to-DC voltage converter.

Another aspect of the present disclosure relates to a method for power regulation of a bus. The method comprises converting, by a direct current (DC)-to-DC voltage converter in a first operating mode, a first DC voltage at a regulated voltage from an AC-to-DC converter to generate a first converted DC voltage to charge a battery. The method further comprises converting, by the DC-to-DC voltage converter in a second operating mode, a second DC voltage from the battery, the second DC voltage having a variable voltage to generate a second converted DC voltage at the regulated voltage for an inverter that is electrically coupled to a motor.

BRIEF DESCRIPTION OF THE DRAWINGS

For a detailed description of various examples, reference will now be made to the accompanying drawings in which.

DETAILED DESCRIPTION

Figure 1:
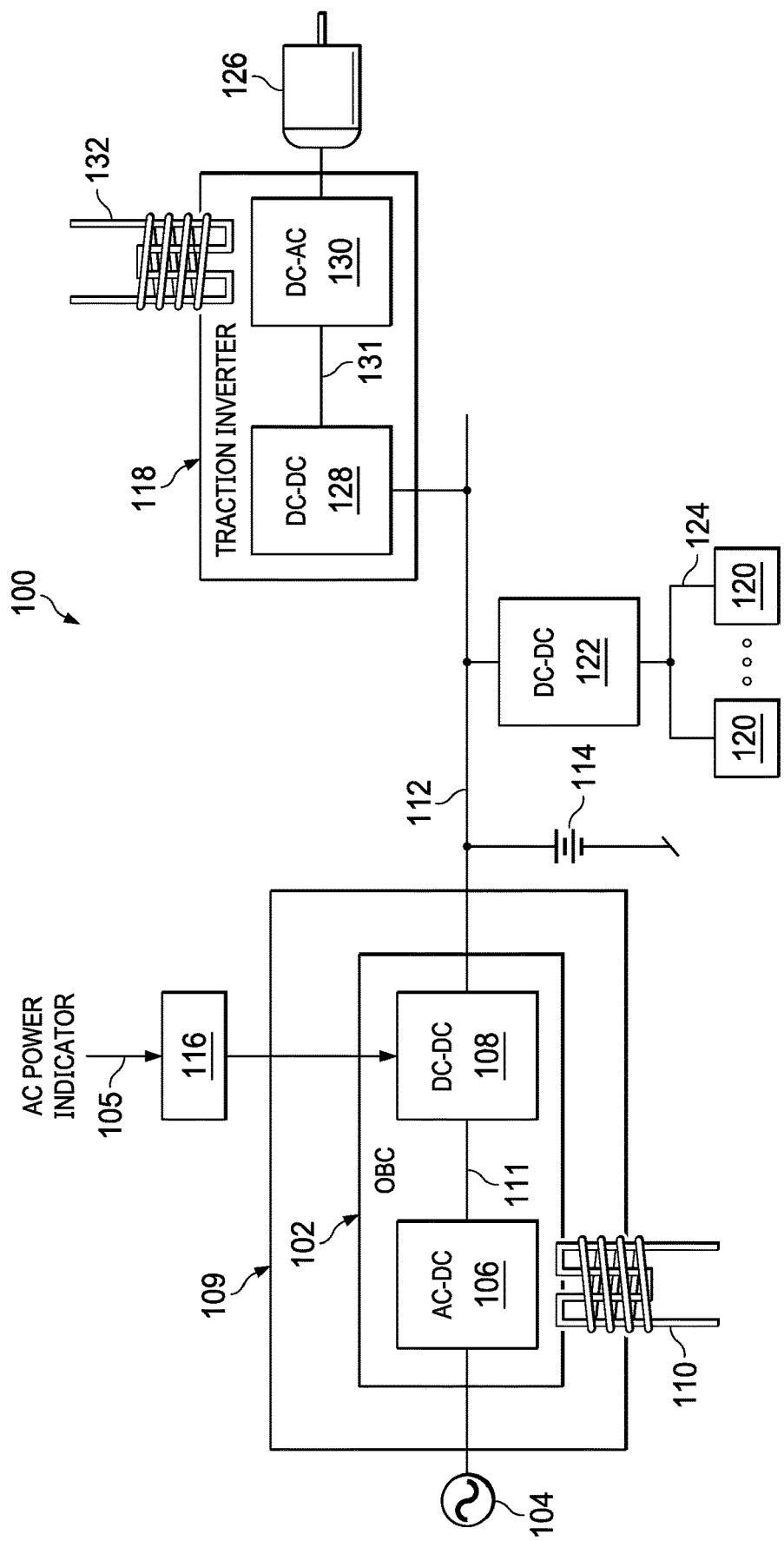
FIGS. 1-4 are architectural diagrams illustrating vehicle powertrains, in accordance with aspects of the present disclosure.

Powertrains for HEV/EV vehicles generally include one or more battery packs (hereinafter referred to as battery). The battery may be charged using an on-board charger (OBC) built into the vehicle. One function of the OBC is to convert power received from a power grid from an alternating current (AC) form to a direct current (DC) form, and to provide the DC power to charge the battery. For example, the OBC may be plugged into a wall outlet and draw power from a public utility power grid to charge the vehicle battery. The OBC may include an AC-to-DC converter (also known as a rectifier) that accepts an input AC voltage, such as 120 VAC, 240 VAC, 480 VAC, etc. from a wall socket and generates an output DC voltage at a first DC voltage. In certain cases this first DC voltage may not be suitable or efficient for charging the battery and the OBC may also include a second stage comprising a DC-to-DC voltage converter which converts the first DC voltage into a second DC voltage, which is more suitable for charging the battery.

In certain cases, the DC-to-DC converter and AC-to-DC converter used in the OBC support bidirectional operation. For example, vehicle-to-grid (V2G) operations may allow a power grid to draw electricity from charged batteries of HEV/EV vehicles to support the power grid. In such cases, the DC-to-DC voltage converter may be configured to draw power from the battery and convert the first DC voltage of the battery to a second DC voltage that the AC-to-DC converter can handle. The AC-to-DC converter then converts the second DC voltage to AC, to send back to the grid.

The powertrain may also include a traction inverter to convert DC voltage from the battery into AC voltage. The traction inverter then provides this AC voltage to one or more electric motors to drive the vehicle. Generally a voltage provided by the battery varies as the battery discharges. Typically the traction inverter takes into account this voltage change and is designed to handle a wide voltage range of DC voltage input that the battery may provide. This ability to handle a wide input voltage range makes the traction inverter less efficient at converting DC-to-AC as compared to an inverter that has a regulated input voltage. For example, an inverter designed for a regulated input voltage may utilize a design or components selected to operate most efficiently at the regulated voltage. As discussed herein, reference to a regulated or fixed voltage refers to a constant voltage within a design tolerance of the converter providing the regulated voltage.

Additionally, other devices, such as on-board computers, adjustable suspension systems, entertainment systems, etc., may utilize electricity provided by the battery. These devices may be isolated from the changing battery voltage on separate electrical busses (such as a 12 v or 48 v bus) driven by other DC-to-DC voltage converters. Such DC-to-DC voltage converters may also be designed to handle the changing battery voltage, making them potentially less efficient than converters designed to take a particular input voltage.

FIG. 1 is an architectural diagram illustrating at least a portion of a vehicle powertrain 100, in accordance with aspects of the present disclosure. In the example vehicle powertrain 100, an OBC 102 is, in a charging operating mode, coupled to an AC power source 104, such as a local power grid. In some cases, the OBC 102 is a two stage charger and includes an AC-to-DC converter 106 and a charger DC-to-DC voltage converter 108 within an OBC housing 109. The AC-to-DC converter 106 converts the AC voltage from AC power source 104 to a first DC voltage and provides this first DC voltage via conductor 111 to the charger DC-to-DC voltage converter 108 to generate a DC voltage at a regulated voltage to drive a variable DC bus 112. In certain cases, the OBC 102 may include a cooling mechanism 110, such as a heatsink, fans, coolant lines, etc. The cooling mechanism 110 may be at least partially incorporated into the OBC housing 109 and the exact mechanism used may be a function of a number of factors such as packaging constraints, efficiency of the OBC 102, or other factors. The cooling mechanism may be configured to reduce an operating temperature of either, or both, the AC-to-DC converter 106 and the charger DC-to-DC voltage converter 108. The DC voltage provided by the OBC 102 energizes the variable DC bus 112 and charges a battery 114 coupled to the variable DC bus 112.

In certain cases, the OBC 102 operates in multiple modes. For example, a control circuit 116 of the OBC 102 detects when the AC power source 104 is plugged in or otherwise becomes available, and responds by switching the OBC 102 into the charging operating mode. An AC power indicator signal 105 is shown in FIG. 1. The AC power indicator signal 105 indicates to the control circuit 116 whether the OBC 102 is connected to the AC power source 104. The control circuit 116 may also receive an indication, for example from the power grid, to provide power to the grid. The control circuit 116 of the OBC 102 can then switch the OBC 102 into a V2G operating mode to possibly provide power back to the grid through AC power source 104. In general, the control circuit 116 configures the DC-to-DC voltage converter 108 to convert a DC voltage from the AC-to-DC voltage converter 106 to a voltage for the variable DC bus 112, or vice versa. The control circuit 116 may be implemented as a programmable processor, a finite state machine, or other suitable type of circuit. When the AC power source 104 is not plugged in or available, the control circuit 116 may switch the OBC 102 into a driving operating mode. Generally, the charging and V2G operating modes are non-overlapping.

In the driving operating mode, the battery 114 energizes the variable DC bus 112, to thereby provide power to a traction inverter 118 as well as one or more body electronics 120. In the example of FIG. 1, body electronics 120 are coupled to, and receive power from, a body electronics bus 124, which may operate at lower voltages than the variable DC bus 112. As an example, an entertainment system or power adjustable seats may operate at 12 v or 48 v rather than the higher voltages typically provided by a HEV/EV battery. One or more body DC-to-DC voltage converters 122 converts the DC voltage of the variable DC bus 112 to another DC voltage appropriate for the body electronics 120 on a corresponding body electronics bus 124. For example, different vehicle electronics may operate at different DC voltages or may be more sensitive to voltage fluctuations, noise, etc., and additional body DC-to-DC voltage converters (not shown) may be attached to the variable DC bus 112 as needed to segregate these components on separate electrical buses.

In the driving operating mode, the traction inverter 118 also draws power from the variable DC bus 112 to drive one or more traction motors 126. The traction inverter 118 converts DC to AC in two stages using a DC-to-DC voltage converter 128 first stage coupled to a DC-to-AC inverter 130 second stage. As the capacity of the battery 114 is drawn down, the voltage across the variable DC bus 112 may change. The DC-to-DC voltage converter 128 converts the variable DC voltage of the variable DC bus 112 to a regulated DC voltage and provides this voltage for the DC-to-AC inverter 130 via conductor 131. The DC-to-AC inverter 130 converts this regulated DC voltage to AC to drive traction motor 126.

In some cases, the two stage conversion of DC-to-DC cascaded with the DC-to-AC traction inverter 118 is more efficient for a motor drive than a single stage inverter, since converting a variable DC voltage to a desired DC voltage can be performed quite efficiently, in some cases greater than 98% efficient. The DC-to-AC inverter 130 may then be optimized for efficiency at the desired DC voltage, for example, by having the switching scheme optimized in an inverter control to reduce its switching loss, to drive motor more efficient for high speed running without the need for field-weakening control In motor drive. The increased efficiency realized by optimizing the DC-to-AC inverter 130 outweighs the losses from the DC-to-DC conversion stage and using a two stage conversion of DC to AC reduces losses as compared to a single stage DC to AC conversion given a relatively large input DC voltage range.

The traction inverter 118 in this example also includes an inverter cooling mechanism 132, such as a heatsink, fans, coolant lines, etc. The inverter cooling mechanism 132 may also be least partially incorporated into the traction inverter 118 housing and may be configured to reduce an operating temperature of either, or both, the inverter DC-to-DC voltage converter 128 and the DC-to-AC inverter 130. The inverter cooling mechanism may be similar to cooling mechanism 110. It may be observed that OBC 109 and traction inverter 118 run in alternative modes. That is, when OBC 109 is running in an active mode, the traction inverter 119 will be in an idle mode and vice versa.

Figure 2:
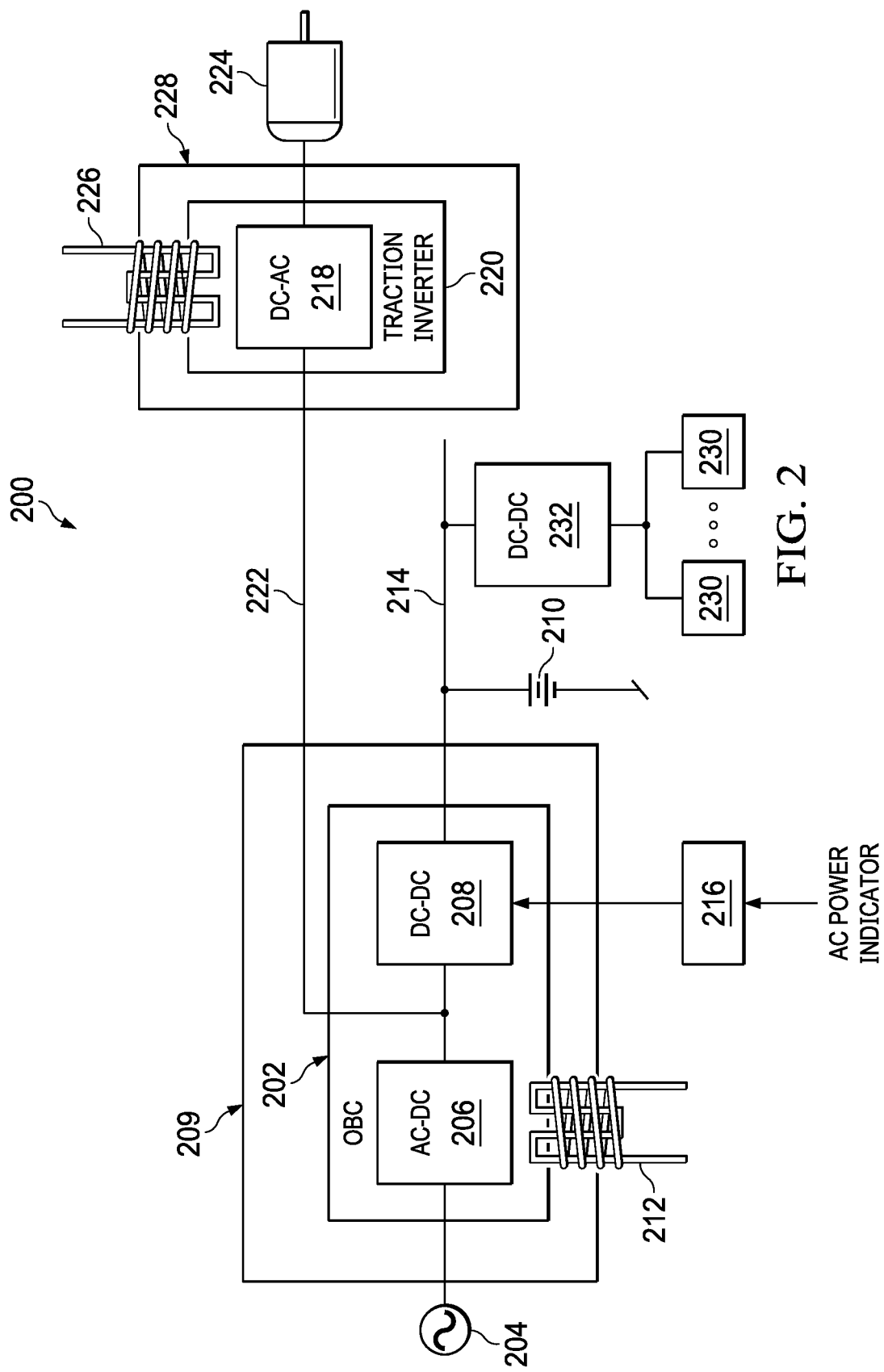

FIG. 2 is another example of at least a portion of a vehicle powertrain 200. Adding a DC-to-DC voltage converter to a traction inverter improves efficiency but potentially increases the size and cooling requirements for the traction inverter. To help address these constraints, the DC-to-DC voltage converter from the OBC may be leveraged to provide a regulated DC voltage for the traction inverter. Generally the charger DC-to-DC voltage converter does not convert power from the power grid to and from the battery at once as vehicles are generally are not driven while plugged in and charging. Using the charger DC-to-DC voltage converter to provide a regulated DC voltage for the traction inverter thus is unlikely to interfere with charging the battery.

In the example vehicle powertrain 200, an OBC 202 is, in a charging mode, coupled to an AC power source 204, such as a local power grid. In this example, OBC 202 is a two stage charger and includes an AC-to-DC converter 206 and a DC-to-DC voltage converter 208 within an OBC housing 209. During charging, the AC-to-DC converter 206 converts the AC voltage from the AC power source 204 to a first DC voltage and provide this first DC voltage to the DC-to-DC voltage converter 208 via a regulated DC bus 222. The DC-to-DC voltage converter 208 generates a second DC voltage to drive a variable DC bus 214 and charge a battery 210 coupled to the variable DC bus 214. The OBC 202 may include a cooling mechanism 212 that may be at least partially incorporated into the OBC housing 209. The cooling mechanism 212 is discussed in more detail above in conjunction with cooling mechanism 110 of FIG. 1.

For switching from the charging operating mode to the driving operating mode, control circuit 216 of the OBC 102 can determine that the AC power source 104 is not plugged in, receive an indication to switch to a driving operating mode, for example from a vehicle control computer (not shown), or otherwise detect that the AC power source is unavailable. For example, an AC power indicator signal 217 indicates to the control circuit 216 that the OBC 202 is not connected to the AC power source 204. The control circuit 216 can then switch the DC-to-DC voltage converter 208 to the driving operating mode and accept input power from the battery 210 rather than from the AC-to-DC converter 206. During a regen operation, the control circuit 216 may receiving an indication to switch to the charging operating mode and switch the DC-to-DC voltage converter 208 to convert voltage from a DC-to-AC inverter 218 of a traction inverter 220 to provide power to charge battery 210 over the variable DC bus 214. In certain cases, the DC-to-AC inverter may be configured to generate DC voltage at the regulated DC voltage, during regen operation. While the control circuit 216 is shown outside of the OBC housing 209, it should be understood that the control circuit 216 may also be located within or on the OBC housing 209.

The DC-to-DC voltage converter 208 converts the variable DC voltage, provided by battery 210, of the variable DC bus 214 to a regulated DC voltage for the regulated DC bus 222. The DC-to-AC inverter 218 of the traction inverter 220 receives power from the regulated DC bus 222 at the regulated DC voltage and converts this regulated DC voltage to AC to drive the traction motor 224. The traction inverter 220 may also include an inverter cooling mechanism 226 which may also be least partially incorporated into a traction inverter housing 228.

Figure 3:
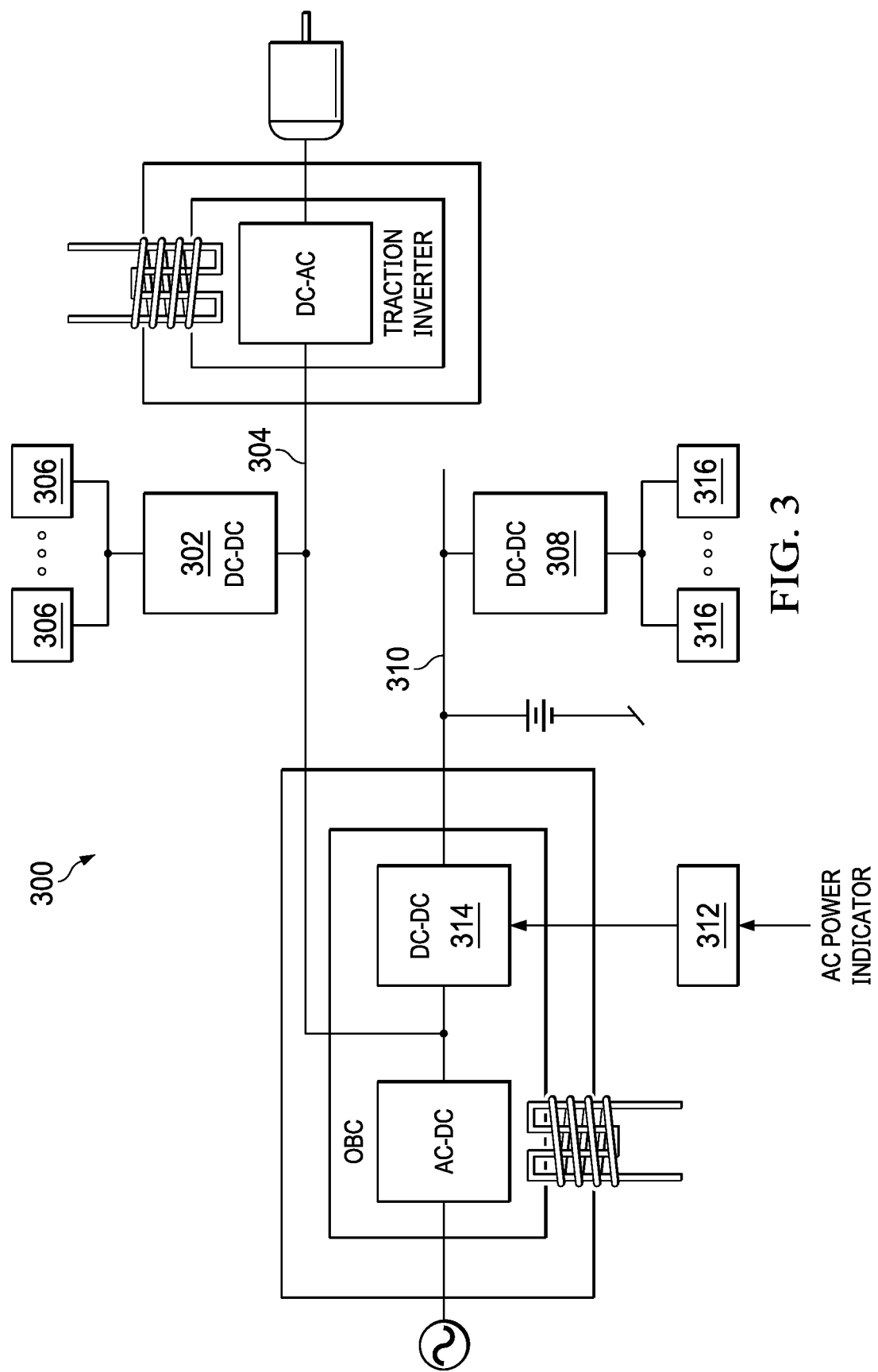

One or more body DC-to-DC voltage converters 232 convert the DC voltage of the variable DC bus 214 to another DC voltage appropriate for one or more body electronics 230. As shown in FIG. 3, in certain cases, one or more regulated body DC-to-DC voltage converters 302 draw power from a regulated DC bus 304 and convert the regulated DC voltage to another DC voltage appropriate for one or more body electronics 306. As the regulated body DC-to-DC voltage converters 302 draw from a regulated DC voltage, the regulated body DC-to-DC voltage converters 302 may be design optimized for efficiency at the regulated DC voltage, helping further increase overall efficiency of the vehicle. In certain cases, one or more body DC-to-DC voltage converters 308 also draw from a variable DC bus 310 for one or more body electronics 316. Control circuit 312 can switch operating modes for a DC-to-DC voltage converter 314 based on, for example, an AC power indicator or another indicator.

In certain embodiments, the OBC 202 includes the AC-to-DC converter 206 within an OBC housing 209 and the DC-to-DC voltage converter 208 incorporated into the traction inverter 220 within the traction inverter housing 228. The control circuit 216, in such embodiments, are coupled to the DC-to-DC voltage converter 208 incorporated into the traction inverter 220.

Figure 4:
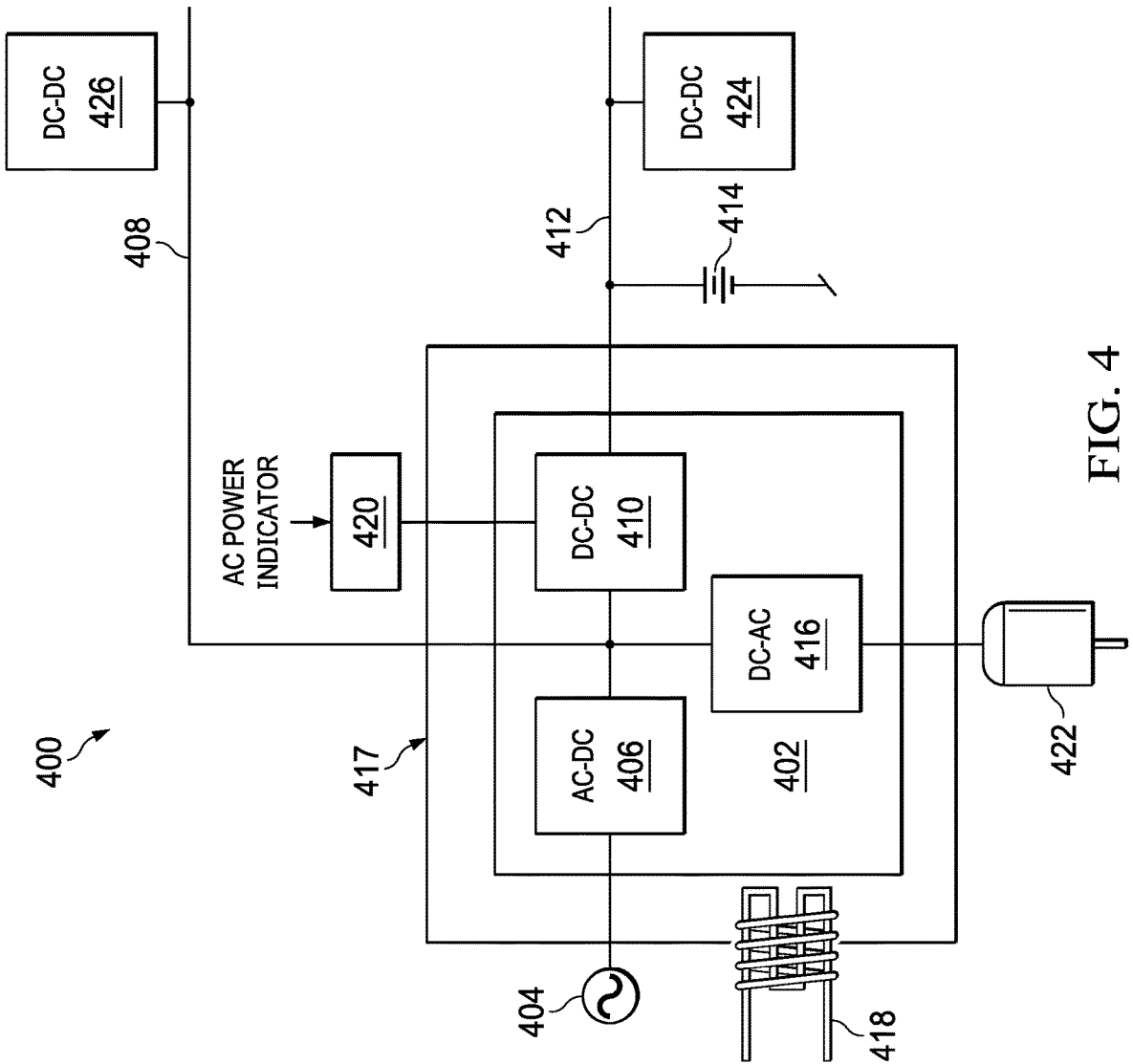

FIG. 4 is another example of at least a portion of a vehicle powertrain 400, in accordance with aspects of the present disclosure. In this example, the OBC and the traction inverter are packaged together in as a combined unit within a common housing to help reduce the physical space taken up by these components and potentially reduce the number of cooling mechanisms.

In the vehicle powertrain 400, a combined unit 402 may be coupled to an AC power source 404 while in a charging operating mode. The combined unit includes an AC-to-DC converter 406 to convert AC voltage from the AC power source 404 to a first DC voltage and provides this first DC current via a regulated DC bus 408. In certain cases, this first DC voltage is at a regulated voltage of the regulated DC bus 408. A DC-to-DC voltage converter 410 within a combined unit housing 417 converts this first DC voltage to a second DC voltage and provides this second DC voltage to a variable DC bus 412 to charge battery 414. A DC-to-AC inverter 416 can be at least partially enclosed within the combined unit housing 417. A cooling mechanism 418 is at least partially incorporated into the combined unit housing 417 and is configured to reduce the operating temperature of one or more of the AC-to-DC converter 406, the DC-to-DC voltage converter 410, and the DC-to-AC inverter 416.

A control circuit 420 switches the DC-to-DC voltage converter 410 from the charging operating mode to a driving operating mode. In the driving operating mode, the DC-to-DC voltage converter 410 draws power from the battery 414, rather than from the AC-to-DC converter 406, over the variable DC bus 412. The DC-to-DC voltage converter 410 converts the variable DC voltage to the regulated DC voltage and provides the regulated DC voltage to a regulated DC bus 408. The DC-to-AC inverter 416 converts the regulated DC voltage, from the regulated DC bus 408, to AC to drive the traction motor 422. While the control circuit 420 is shown outside of the combined unit housing 417, it should be understood that the control circuit 420 may also be located within the combined unit housing 417.

One or more body DC-to-DC voltage converters 424 draws from the variable DC bus 412 to convert the DC voltage of the variable DC bus 412 to another DC voltage appropriate for certain body electronics (not shown). One or more regulated body DC-to-DC voltage converters 426 draw power from a regulated DC bus 408 and convert the regulated DC voltage to another DC voltage appropriate for one or more body electronics (not shown).

Figure 5:
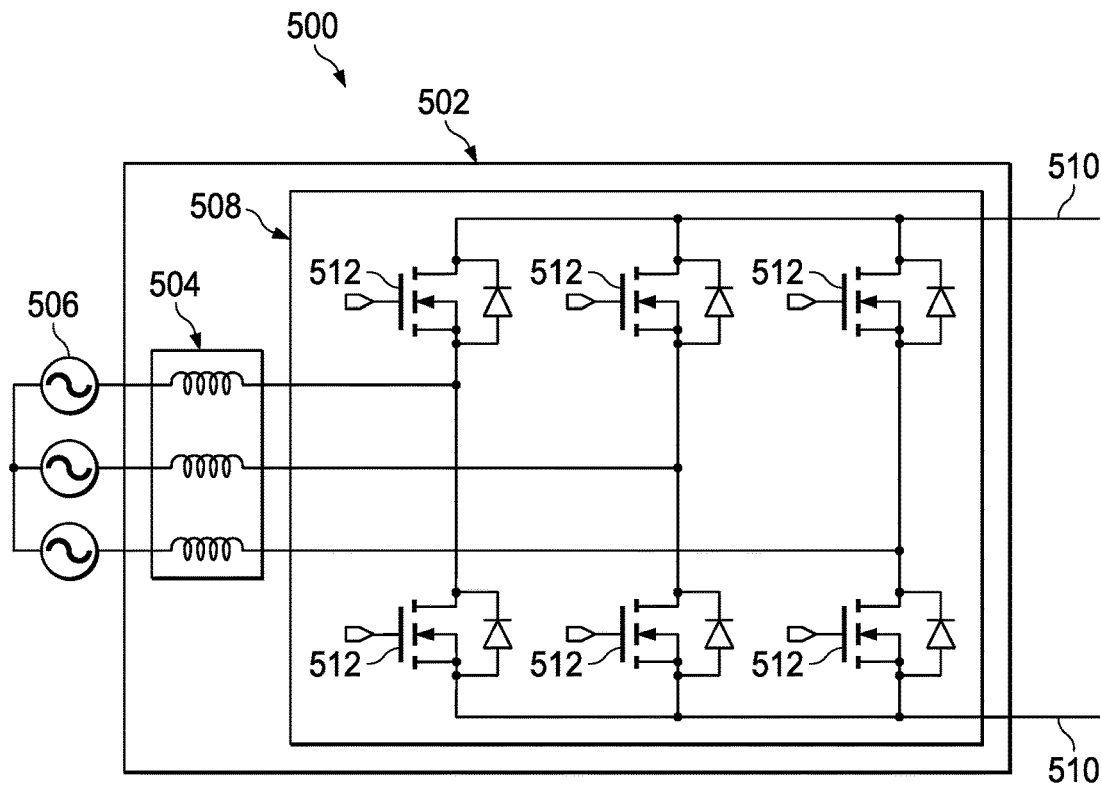
FIG. 5 is a circuit diagram of a power factor correction circuit, in accordance with aspects of the present disclosure.

FIG. 5 is a circuit diagram of an example power factor correction circuit 500, in accordance with aspects of the present disclosure. Generally, an AC-to-DC converter 502 includes some passive components 504, such as inductors (as shown in this example), inductor capacitor, or inductor capacitor inductor, as well as an AC-to-DC bridge structure 508. The passive components connect to the AC-to-DC bridge structure 508 to form the full AC-to-DC converter. For example, AC-to-DC converters 106, 206, and 406 of FIGS. 1, 2, and 4, respectively, include passive components 504 and the AC-to-DC bridge structures 508. In this example, three different voltages from an AC power source 506 may be connected to the passive components 504 to form a three phase power factor correction (PFC) (as shown). In certain cases two phases may include passive components and one phase might not have a passive component for a single phase PFC (not shown). In other cases, a mux version may be offered to support both single phase and three phase PFC (not shown). The AC-to-DC bridge structure 508 and passive components 504 work together to generate a regulated bus at the output of the AC-to-DC converter 510. In certain cases, the AC-to-DC bridge structure 508 for a typical three phase inverter comprises three half bridges 512. The half bridges 512 are controlled by control circuitry (not shown) to regulate the current through each phase. The control is achieved by turning on and tuning off the power devices of the half bridges 512. Duty cycle regulation is typically used, in which the converter in the AC-to-DC mode for PFC, the AC-to-DC bridge structure 508 behaves as a boost circuit. When operating in the DC-AC mode for motor control, the AC-to-DC bridge structure 508 behaves as a buck circuit. While, in the example, a two level three phase inverter structure is shown in the AC-to-DC bridge structure 508, the two level three phase inverter structure can be replaced with a three level or a different inverter structure.

Figure 6:
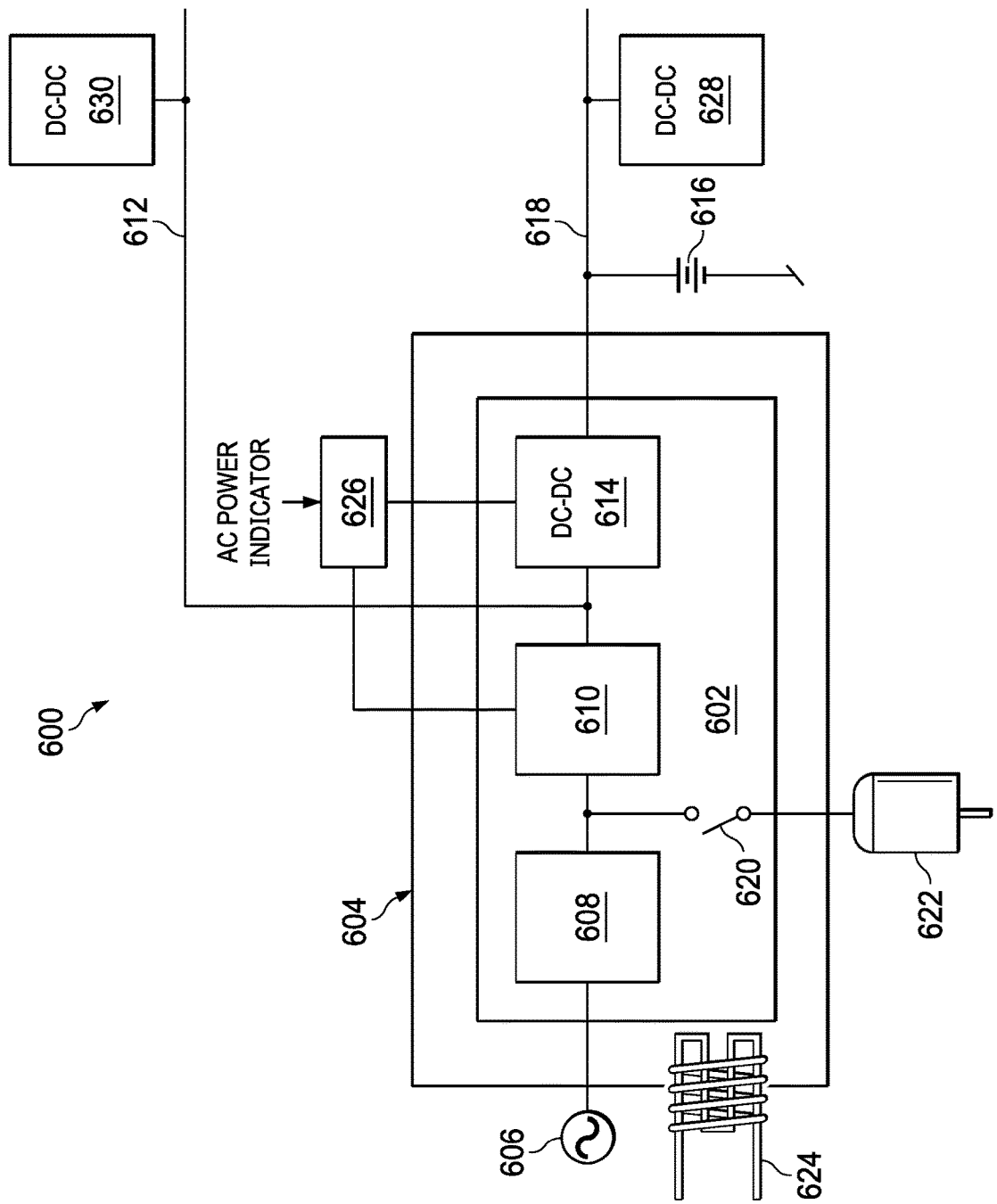
FIG. 6 is an architecture diagram illustrating at least a portion of a vehicle powertrain, in accordance with aspects of the present disclosure

FIG. 6 is an architecture diagram illustrating at least a portion of a vehicle powertrain 600, in accordance with aspects of the present disclosure. In this example, functionality of the OBC and traction inverter are integrated into a combined unit 602, which is at least partially contained within a combined housing 604.

In the vehicle powertrain 600, the combined unit 602 may be coupled to an AC power source 606 while in a charging operating mode. The combined unit 602 may include passive components 608 needed for the AC-to-DC stage, an AC-to-DC converter components (including associated bridge structure, sense electronics, and control circuitry) 610, and a DC-to-DC voltage converter 614. The AC voltage from the AC power source 606 is connected to the passive components 608 and provided to the AC-to-DC converter components 610, to convert AC voltage from the AC power source 606 to the first DC voltage. In a manner similar to that shown in FIG. 4, the first DC voltage is provided via a DC regulated bus 612 to the DC-to-DC voltage converter 614 to charge battery 616 via a variable DC bus 618. Switch 620 may be coupled between a traction motor 622 and a connection point of the passive components 608 and the AC-to-DC converter components 610. In this case, the AC-to-DC converter components 610 may comprise a three phase half bridge inverter capable of operating as an active PFC as well as a traction drive, depending on the operating mode. During charging, switch 620 is open and a traction motor 622 is not powered. While a single switch 620 is shown, it can be understood that switch 620 may comprise three switches, one for each phase line coupled to the motor. The passive components 608, AC-to-DC converter components 610, and DC-to-DC voltage converter 614 can be at least partially enclosed within the combined housing 604. A cooling mechanism 624 is at least partially incorporated into the combined housing 604 and is configured to reduce the operating temperature of one or more of the AC-to-DC converter components 610, the DC-to-DC voltage converter 614, and the passive components 608.

A control circuit 626 switches the DC-to-DC voltage converter 614 and the AC-to-DC converter components 610 from the charging operating mode to a driving operating mode. While the control circuit 626 is shown outside of the combined housing 604, it should be understood that the control circuit 626 may also be located within the combined housing 604.

In the driving operating mode, the DC-to-DC voltage converter 614 draws power from the battery 616, rather than from the AC-to-DC converter components 610, over the variable DC bus 618. The DC-to-DC voltage converter 614 converts the variable DC voltage to the regulated DC voltage and provides the regulated DC voltage to a regulated DC bus 612. Though in certain embodiments, the battery voltage may directly be used by the AC-to-DC converter components 610 over the variable DC bus 618. The AC-to-DC converter components 610, in the driving operating mode, converts the regulated DC voltage, from the regulated DC bus 612, to AC to drive the traction motor 622. When in an operating mode other than the charging operating mode, the passive components 608 are open circuits and are unaffected by power from the AC-to-DC converter components 610 or traction motor 622.

One or more body DC-to-DC voltage converters 628 draws from the variable DC bus 618 to convert the DC voltage of the variable DC bus 618 to another DC voltage appropriate for certain body electronics (not shown). One or more regulated body DC-to-DC voltage converters 630 draw power from a regulated DC bus 612 and convert the regulated DC voltage to another DC voltage appropriate for one or more body electronics (not shown).

Figure 7:
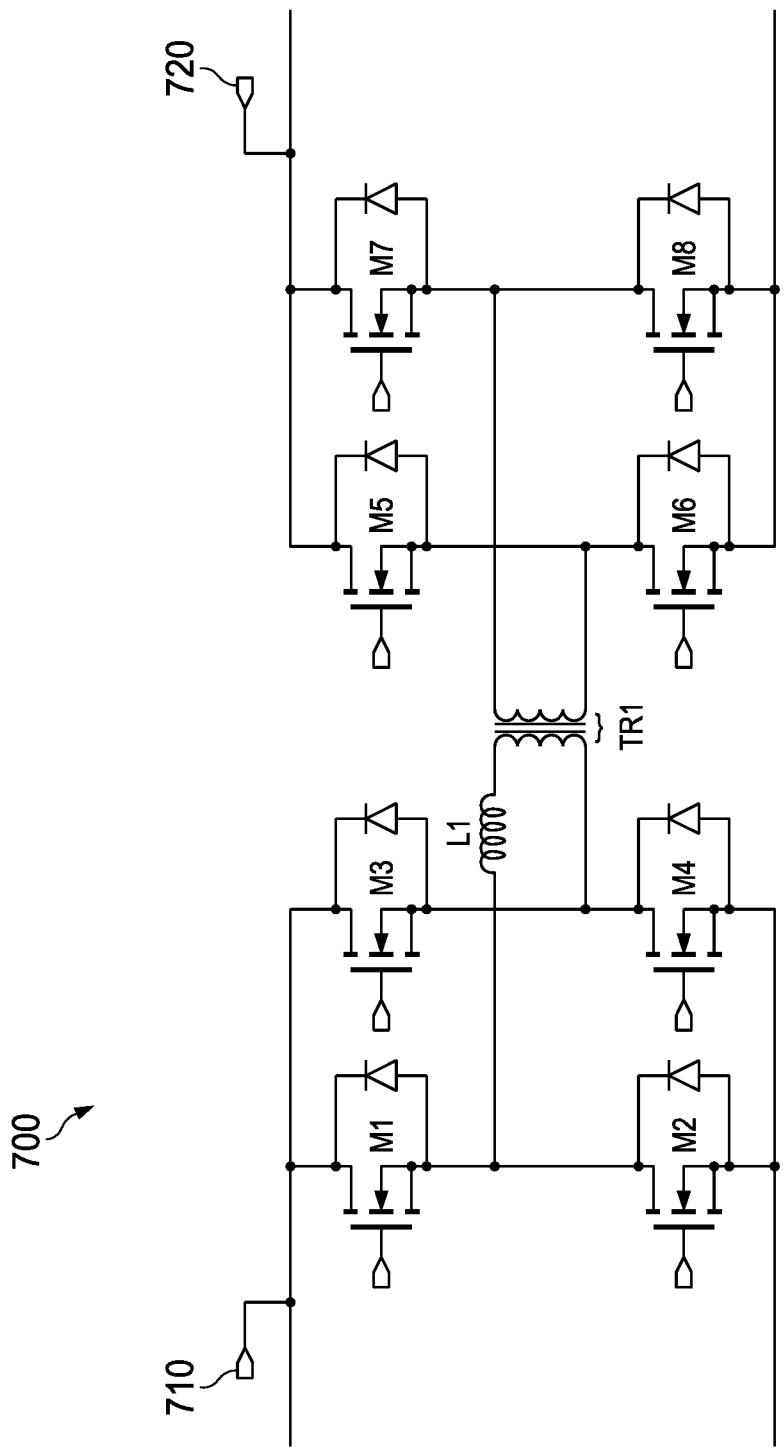
FIG. 7 is a circuit diagram illustrating an example DC-to-DC voltage converter circuit, in accordance with aspects of the present disclosure.

FIG. 7 is a circuit example of the DC-to-DC voltage converter 700 circuit usable in the examples described above (e.g., for DC-to-DC voltage converters 108, 208, 314, and 410). The DC-to-DC voltage converter 700 is a bi-directional voltage converter and is controlled by a control circuit (control circuit 116, 216, 312, 420, and 614). In a first mode, the corresponding control circuit configures the bidirectional DC-to-DC voltage converter 700 to accept input power from a first voltage node 710 and output converted power to a second voltage node 720. In a second mode, the control circuit configures the DC-to-DC voltage converter 700 to accept input power from the second voltage node 720 and output converted power to the first voltage node 710.

Referring still to FIG. 7, the bi-directional DC-to-DC voltage converter 700 includes transistors M1, M2, M3, M4, M5, M6, M7 and M8, inductor L1, and transformer TR1. The transistors are implemented as n-channel metal oxide semiconductor field effect transistors (NMOS), but can be implemented as p-channel metal oxide semiconductor field effect transistors (PMOS) in other implementations, or as bipolar junction transistors in yet other implementations. Each transistor M1-M6 includes a control input (e.g., a gate) that is controlled by the corresponding control circuit to turn that respective transistor on or off depending on the operating mode. M1, M2, M3 and M4 form a first full bridge and M5, M6, M7 and M8 for a second full bridge. Both duty cycle control and phase control of M1-M8 are used to control and regulate the power flow.

Figure 8:
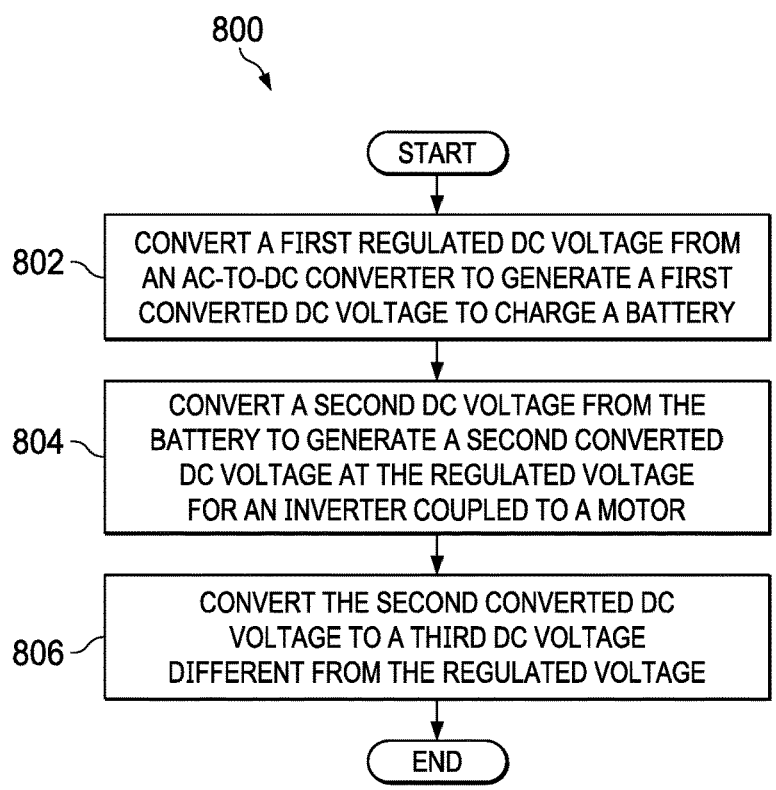
FIG. 8 is a flow diagram illustrating a technique for power regulation of a bus, in accordance with aspects of the present disclosure.

FIG. 8 is a flow diagram illustrating a technique 800 for power regulation of a bus, in accordance with aspects of the present disclosure. At block 802, a DC-to-DC voltage converter in a first operating mode converts a first DC voltage at a regulated voltage from an AC-to-DC converter to generate a first converted DC voltage to charge one or more batteries. At block 804, the Dc-to-DC voltage converter is in a second operating mode and converts a second DC voltage from the batteries to generate a second converted DC voltage at the regulated voltage for an inverter that is electrically coupled to a motor. The second DC voltage has a variable voltage that may vary based on the charge level of the batteries. At block 806, the Dc-to-DC voltage converter is in a second operating mode and generates the second converted DC voltage for a second DC-to-DC voltage converter to convert the second converted DC voltage to a third DC voltage different from the regulated voltage.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

The invention claimed is:

1. A device for power regulation, the device comprising:
a first direct current (DC)-to-DC voltage converter that includes:
   a first set of terminals configured to couple to a regulated voltage bus, the regulated voltage bus coupled to an alternating current (AC)-to-DC converter and a traction inverter that is separate from the AC-to-DC converter; and
   a second set of terminals configured to couple to a variable voltage bus, the variable voltage bus coupled to a battery;
wherein the first DC-to-DC voltage converter is configurable to:
   convert a first DC voltage from the AC-to-DC converter to generate a first converted DC voltage to charge the battery via the variable voltage bus; and
   convert a second DC voltage from the battery to a second converted DC voltage for transmission to the traction inverter via the regulated voltage bus;
a second DC-to-DC voltage converter coupled to the regulated voltage bus, the second DC-to-DC voltage converter configured to convert the second converted DC voltage to a third DC voltage;
a third DC-to-DC voltage converter coupled to the variable voltage bus and configured to convert the first converted DC voltage to a fourth DC voltage different from the first converted DC voltage and different from the third DC voltage; and
control circuitry to direct an operating mode of the first DC-to-DC voltage converter by:
   controlling the first DC-to-DC voltage converter to convert the first DC voltage from the AC-to-DC converter when an AC power source is available; and
   controlling the first DC-to-DC voltage converter to convert the second DC voltage from the battery when the AC power source is not available.

2. The device of claim 1, further including a housing and the AC-to-DC converter, wherein the first DC-to-DC voltage converter and the AC-to-DC converter are at least partially enclosed within the housing.

3. The device of claim 2, wherein the housing includes a cooling mechanism.

4. The device of claim 3, wherein the cooling mechanism reduces an operating temperature of at least one of the first DC-to-DC voltage converter and the AC-to-DC converter.

5. The device of claim 1, wherein the first DC-to-DC voltage converter is further configurable to:
receive the first DC voltage from the AC-to-DC converter in a first operating mode; and
receive the second DC voltage from the battery in a second operating mode, the first and second operating modes being non-overlapping modes of operation, and the control circuitry to direct switching between the first and second operating modes.

6. A system for power regulation, the system comprising:
a first direct current (DC)-to-DC voltage converter that includes:
   a first set of terminals configured to couple to a regulated voltage bus, the regulated voltage bus coupled to an alternating current (AC)-to-DC converter and to a traction inverter that is separate from the AC-to-DC converter; and
   a second set of terminals configured to couple to a variable voltage bus, the variable voltage bus coupled to a battery;
wherein the first DC-to-DC voltage converter is capable of operating in at least one of a first operating mode and a second operating mode to:
   when operating in the first operating mode, convert a first DC voltage from the AC-to-DC converter to generate a first converted DC voltage to charge the battery via the variable voltage bus; and
   while operating in the second operating mode, convert a second DC voltage from the battery to a second converted DC voltage for transmission to the traction inverter via the regulated voltage bus;
a second DC-to-DC voltage converter coupled to the regulated voltage bus, the second DC-to-DC voltage converter configured to convert the second converted DC voltage to a third DC voltage;
a third DC-to-DC voltage converter coupled to the variable voltage bus and configured to convert the first converted DC voltage to a fourth voltage different from the first converted DC voltage and different from the third DC voltage; and
control circuitry to direct an operating mode of the first DC-to-DC voltage converter by:
   switching the first DC-to-DC voltage converter to operate in the first operating mode when an AC power source is available; and
   switching the first DC-to-DC voltage converter to operate in a second operating mode when the AC power source is not available.

7. The system of claim 6, wherein at least one of the first DC-to-DC voltage converter and the AC-to-DC converter are at least partially enclosed within a housing.

8. The system of claim 7, wherein the housing includes a cooling mechanism.

9. The system of claim 8, wherein the cooling mechanism is to reduce an operating temperature of at least one of the first DC-to-DC voltage converter and the AC-to-DC converter.

10. The system of claim 6, wherein the first and second operating modes are non-overlapping modes of operation, the control circuitry to direct switching between the first and second operating modes.

11. A device comprising:
a first direct-current-to-direct-current (DC-to-DC) converter configured to be coupled to a first direct current (DC) bus with a regulated voltage and a second DC bus, the first DC bus coupled to an alternating-current-to-direct-current (AC-to-DC) converter and to a traction inverter separate from the AC-to-DC converter and the second DC bus coupled to a battery via a variable voltage bus, the first DC-to-DC converter configured to:

operate in a first mode to receive power from the AC-to-DC converter via the first DC bus and convert the power from the AC-to-DC converter to provide a voltage on the second DC bus;

operate in a second mode to receive power from the battery via the second DC bus and convert the power from the battery to provide a voltage on the first DC bus; and operate in a third mode to receive power from the traction inverter via the first DC bus and convert the power from the traction inverter to provide a voltage on the second DC bus;

a second DC-to-DC voltage converter coupled to the first DC bus, the second DC-to-DC voltage converter configured to convert the regulated voltage to a DC voltage;

a third DC bus;

a third DC-to-DC converter coupled to the second DC bus and the third DC bus, the third DC-to-DC converter configured to receive power from the battery via the second DC bus and convert the power from the battery to provide a voltage on the third DC bus, wherein the voltage provided by the third DC-to-DC converter is different from the DC voltage; and control circuitry configured to:
control the first DC-to-DC converter to operate in the first mode when an AC power source is plugged in; and
control the first DC-to-DC converter to operate in the second mode when the AC power source is not plugged in.

12. The device of claim 11, wherein the first DC-to-DC converter is configured to convert the power from the battery to provide a regulated voltage on the first DC bus over a range of battery voltages.

13. The device of claim 11, wherein the control circuitry is configured to cause the first DC-to-DC converter to switch between the first mode, the second mode, and the third mode.

14. The device of claim 11, further including the AC-to-DC converter and a housing enclosing at least a portion of the first DC-to-DC converter and at least a portion of the AC-to-DC converter.

15. The device of claim 11, further including:
the traction inverter coupled to the first DC bus, the traction inverter configured to couple to a motor, the first DC-to-DC converter configured to operate in the second mode to convert the power from the battery to provide power to the motor via the traction inverter.

16. The device of claim 11, wherein the third DC-to-DC converter is further configured to receive power from the first DC-to-DC converter and convert the power from the first DC-to-DC converter to provide a voltage on the third DC bus.

17. The device of claim 2, wherein the housing at least partially encloses the first DC-to-DC voltage converter, the AC-to-DC converter, and the traction inverter.

* * * * *